US011800780B2

(12) United States Patent
Ji

(10) Patent No.: US 11,800,780 B2
(45) Date of Patent: Oct. 24, 2023

(54) MASK DEVICE AND MANUFACTURING METHOD THEREOF, EVAPORATION METHOD AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Fengli Ji, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 758 days.

(21) Appl. No.: 16/965,068

(22) PCT Filed: Sep. 12, 2019

(86) PCT No.: PCT/CN2019/105713
§ 371 (c)(1),
(2) Date: Jul. 27, 2020

(87) PCT Pub. No.: WO2021/046807
PCT Pub. Date: Mar. 18, 2021

(65) Prior Publication Data
US 2022/0384726 A1      Dec. 1, 2022

(51) Int. Cl.
*H01L 51/00* (2006.01)
*C23C 14/04* (2006.01)
(Continued)

(52) U.S. Cl.
CPC ......... *H10K 71/166* (2023.02); *C23C 14/042* (2013.01); *C23C 14/12* (2013.01);
(Continued)

(58) Field of Classification Search
CPC ............................ H01L 51/0011; H01L 51/56
See application file for complete search history.

(56) References Cited

U.S. PATENT DOCUMENTS 10,131,982 B2   11/2018   Ji et al.
10,337,097 B2   7/2019   Ji et al.
(Continued)

FOREIGN PATENT DOCUMENTS

CN   105586568 A   5/2016
CN   105839052 A   8/2016
(Continued)

OTHER PUBLICATIONS

Office Action issued by the Chinese Patent Office in the corresponding application No. 202080002236.2 and its English translation dated of Apr. 18, 2022.

*Primary Examiner* — Dale E Page
*Assistant Examiner* — Wilner Jean Baptiste
(74) *Attorney, Agent, or Firm* — Leason Ellis LLP

(57) ABSTRACT

Disclosed are a mask device, a manufacturing method thereof, an evaporation method and a display device. The mask device includes: a mask frame; at least one first mask strip extending in a first direction, at least one second mask strip extending in a second direction, and a first mask plate extending in the first direction, which are fixed on the mask frame. The first direction crosses the second direction, the first mask strip and the second mask strip are intersected to define at least one mask opening, the first mask plate includes a mask pattern region, and the mask pattern region includes a first group of through holes covered by an orthographic projection of the at least one mask opening on the first mask plate, and a second group of through holes covered by an orthographic projection of the first and second mask strips on the first mask plate.

20 Claims, 6 Drawing Sheets

(51) Int. Cl.
  *H10K 71/16*   (2023.01)
  *C23C 14/12*   (2006.01)
  *C23C 14/24*   (2006.01)
  *H10K 71/00*   (2023.01)
(52) U.S. Cl.
  CPC ............. *C23C 14/24* (2013.01); *H10K 71/00* (2023.02); *H10K 71/164* (2023.02)

(56) References Cited

U.S. PATENT DOCUMENTS

| | | | |
|---|---|---|---|
| 10,982,314 | B2 | 4/2021 | Lin et al. |
| 2004/0183435 | A1 | 9/2004 | Ohshita |
| 2016/0079334 | A1* | 3/2016 | Lee ............... H10K 71/00 438/34 |
| 2017/0271421 | A1* | 9/2017 | Jinbo ............... H10K 59/124 |
| 2018/0009190 | A1 | 1/2018 | Ochi et al. |
| 2018/0209029 | A1 | 7/2018 | Lin et al. |
| 2019/0032192 | A1 | 1/2019 | Zhang |
| 2020/0340093 | A1 | 10/2020 | Su et al. |
| 2021/0164087 | A1 | 6/2021 | Lin et al. |

FOREIGN PATENT DOCUMENTS

| | | |
|---|---|---|
| CN | 205556762 | 9/2016 |
| CN | 106086782 A | 11/2016 |
| CN | 106480404 A | 3/2017 |
| CN | 107460436 | 12/2017 |
| CN | 107815641 A | 3/2018 |
| CN | 108642441 | 10/2018 |
| CN | 109554664 | 4/2019 |
| CN | 110117768 | 8/2019 |
| JP | 2016003386 A | 1/2016 |
| KR | 1020060129899 | 12/2006 |
| KR | 101659948 B1 | 10/2016 |

* cited by examiner

MASK DEVICE AND MANUFACTURING METHOD THEREOF, EVAPORATION METHOD AND DISPLAY DEVICE

CROSS-REFERENCE TO RELATED PATENT APPLICATIONS

This application is a U.S. National Stage Application under 35 U.S.C. § 371 of International Patent Application No. PCT/CN2019/105713, filed Sep. 12, 2019, which is incorporated by reference in its entirety.

TECHNICAL FIELD

Embodiments of the present disclosure relate to a mask device and a manufacturing method thereof, an evaporation method and a display device.

BACKGROUND

Organic light emitting diode (OLED) display panels have advantages of thin thickness, light weight, wide viewing angle, active luminescence, continuously adjustable luminescence color, low cost, fast response speed, low energy consumption, low driving voltage, wide working temperature range, simple production process, high luminous efficiency and flexible display, etc., and have been widely used in mobile phones, tablet computers, digital cameras and other display fields. In order to improve the color gamut, contrast and brightness efficiency of OLED display panels, independent sub-pixel light emitting layers are often used to realize color display. For example, red (R) sub-pixels adopt red light emitting layers, green (G) sub-pixels adopt green light emitting layers, and blue (B) sub-pixels adopt blue light emitting layers.

Generally, a thin film deposition method, such as evaporation, etc., is adopted to manufacture OLED display panels, especially small-sized OLED display panels. A fine metal mask (FMM) is needed in the case where the independent sub-pixel light emitting layer is evaporated. The quality of FMM, such as the stress uniformity of FMM and the position accuracy of grid structure, etc., directly determines the evaporation quality of light emitting layer, and further affects the display effect. Therefore, improving the quality of FMM is very important to improve the quality of the display panel.

SUMMARY

At least one embodiment of the present disclosure provides a mask device, which includes: a mask frame; at least one first mask strip extending in a first direction and at least one second mask strip extending in a second direction, which are fixed on the mask frame; and a first mask plate extending in the first direction and fixed on the mask frame, wherein the first direction is intersected with the second direction, the at least one first mask strip and the at least one second mask strip are intersected with each other to define at least one mask opening, the first mask plate includes a mask pattern region, the mask pattern region includes a plurality of through holes arranged in an array, the plurality of through holes include a first group of through holes and a second group of through holes, an orthographic projection of the at least one mask opening on the first mask plate covers the first group of through holes in the mask pattern region, and an orthographic projection of the at least one first mask strip and the at least one second mask strip on the first mask plate covers the second group of through holes in the mask pattern region.

For example, in the mask device provided by some embodiments of the present disclosure, the second group of through holes surround the first group of through holes.

For example, in the mask device provided by some embodiments of the present disclosure, the first mask plate is on one side of the at least one first mask strip and the at least one second mask strip away from the mask frame.

For example, in the mask device provided by some embodiments of the present disclosure, the plurality of through holes are uniformly distributed in the mask pattern region.

For example, in the mask device provided by some embodiments of the present disclosure, in the first direction and the second direction, a spacing between two adjacent through holes of the first group of through holes, a spacing between two adjacent through holes of the second group of through holes, and a spacing between one through hole of the first group of through holes and one through hole of the second group of through holes adjacent to the one through hole of the first group of through holes, are equal.

For example, in the mask device provided by some embodiments of the present disclosure, a region in which the first group of through holes are located and a region in which the second group of through holes are located are continuous and together form a rectangular mask pattern region.

For example, in the mask device provided by some embodiments of the present disclosure, the mask pattern region includes a plurality of first regions arranged in the first direction, the first group of through holes are arranged in the plurality of first regions, the mask pattern region further includes a plurality of second regions respectively surrounding the plurality of first regions, the second group of through holes are arranged in the plurality of second regions, each of the plurality of first regions is rectangular, and each of the plurality of the second regions is rectangular ring shaped.

For example, in the mask device provided by some embodiments of the present disclosure, the plurality of through holes are the same in shape and size.

For example, in the mask device provided by some embodiments of the present disclosure, the shape of each of the plurality of through holes includes one selected from the group consisting of rectangle, diamond, circle and hexagon.

For example, in the mask device provided by some embodiments of the present disclosure, the plurality of through holes are arranged in the first direction to form a plurality of through hole rows, and an orthographic projection of each of the at least one first mask strip on the first mask plate covers at least three of the plurality of through hole rows.

For example, in the mask device provided by some embodiments of the present disclosure, the plurality of through holes are arranged in the second direction to form a plurality of through hole columns, and an orthographic projection of each of the at least one second mask strip on the first mask plate covers at least three of the plurality of through hole columns.

For example, in the mask device provided by some embodiments of the present disclosure, the mask device includes a plurality of the first mask plates, and an orthographic projection of a gap between two adjacent first mask plates on the first mask strip is within the first mask strip.

For example, in the mask device provided by some embodiments of the present disclosure, the at least one first mask strip and the at least one second mask strip are arranged separately or integrally.

For example, in the mask device provided by some embodiments of the present disclosure, the shape of the mask opening includes one selected from the group consisting of rectangle, circle, ellipse, sector and polygon.

For example, in the mask device provided by some embodiments of the present disclosure, the first mask plate further includes two end portions at two sides of the mask pattern region in the first direction, and each of the two end portions includes an edge flush with an outer edge of the mask frame.

At least one embodiment of the present disclosure further provides a manufacturing method of a mask device, which includes: fixing at least one first mask strip and at least one second mask strip on a mask frame, wherein the at least one first mask strip extends in a first direction and the at least one second mask strip extends in a second direction, the first direction is intersected with the second direction, and the at least one first mask strip and the at least one second mask strip are intersected with each other to define at least one mask opening; and fixing a first mask plate on the mask frame, wherein the first mask plate extends in the first direction, the first mask plate includes a mask pattern region, the mask pattern region includes a plurality of through holes arranged in an array, the plurality of through holes include a first group of through holes and a second group of through holes, an orthographic projection of the at least one mask opening on the first mask plate covers the first group of through holes in the mask pattern region, and an orthographic projection of the at least one first mask strip and the at least one second mask strip on the first mask plate covers the second group of through holes in the mask pattern region.

For example, in the manufacturing method provided by some embodiments of the present disclosure, the fixing the first mask plate on the mask frame includes: fixing the first mask plate on one side of the at least one first mask strip and the at least one second mask strip away from the mask frame.

For example, in the manufacturing method provided by some embodiments of the present disclosure, a fixing method of the at least one first mask strip and the at least one second mask strip or a fixing method of the first mask plate includes soldering.

At least one embodiment of the present disclosure further provides an evaporation method, which includes: evaporating an object to be evaporated by using the mask device according to any one embodiment of the present disclosure as a mask.

For example, in the evaporation method provided by some embodiments of the present disclosure, the object to be evaporated includes at least one region to be evaporated, the at least one region to be evaporated corresponds to the at least one mask opening, and the at least one mask opening exposes the at least one region to be evaporated corresponding to the at least one mask opening.

For example, in the evaporation method provided by some embodiments of the present disclosure, the evaporating the object to be evaporated includes: forming at least one functional layer of a light emitting element on the object to be evaporated by evaporation.

For example, in the evaporation method provided by some embodiments of the present disclosure, a pattern of the at least one functional layer is substantially the same as a pattern of each of the first group of through holes.

At least one embodiment of the present disclosure further provides a display device, which includes a light emitting element formed by the evaporation method according to any one embodiment of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
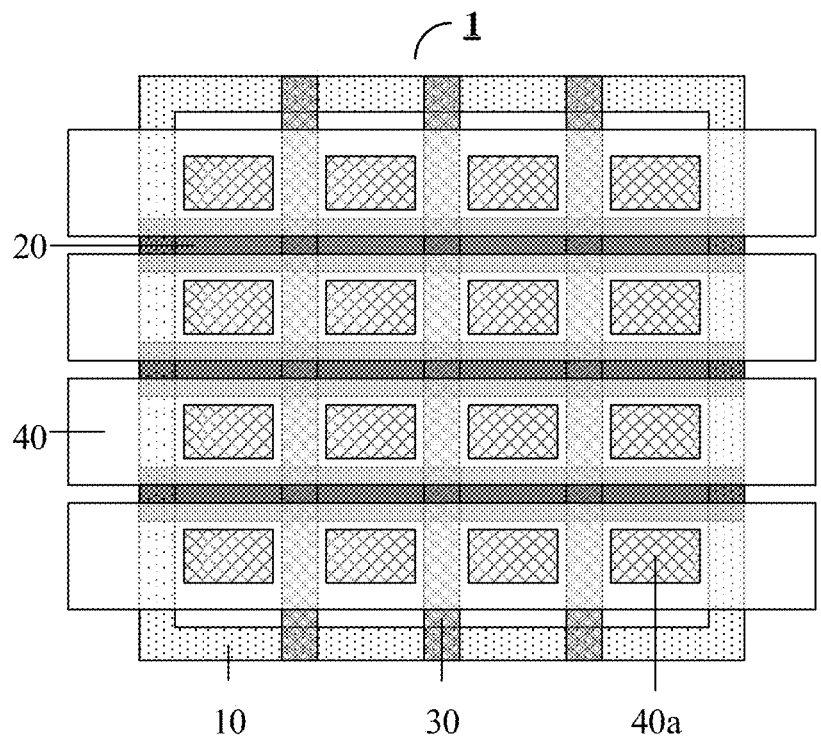
FIG. 1 is a schematic top view of a mask device.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Similarly, similar words such as "a", "an" or "the" do not denote a limitation of quantity, but rather denote the presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "Upper", "lower", "left", "right", etc. are only used to indicate the relative positional relationship, and when the absolute position of the object to be described is changed, the relative positional relationship can also change accordingly.

The present disclosure is described below with reference to several specific embodiments. In order to keep the following description of the embodiments of the present disclosure clear and concise, detailed descriptions of known functions and known components or elements may be omitted. When any one component or element of an embodiment of the present disclosure appears in more than one of the accompanying drawings, the component or element is denoted by a same or similar reference numeral in each of the drawings.

FIG. 1 is a schematic top view of a mask device. As illustrated in FIG. 1, the mask device 1 includes a frame such as a metal frame 10, and further includes a plurality of shielding strips (Cover) 20, a plurality of supporting strips (Howling) 30, and a plurality of elongated fine metal mask (FMM) plates 40 arranged on the metal frame 10. The metal frame 10 has an opening region, and the plurality of fine metal mask plates 40 are arranged side by side with each other to basically cover the opening region surrounded by the metal frame 10. Each fine metal mask plate 40 is provided with a plurality of mask pattern regions 40a, and the mask pattern regions 40a correspond to the openings defined by the intersection of the shielding strips 20 and the supporting strips 30. For example, as illustrated in FIG. 1, the orthographic projection of the mask pattern region 40a on the plane of a corresponding opening is located in the corresponding opening (or the orthographic projection of the mask pattern region 40a on a plane of the metal frame 10 is located in the orthographic projection of the corresponding opening on the plane).

Figure 2:
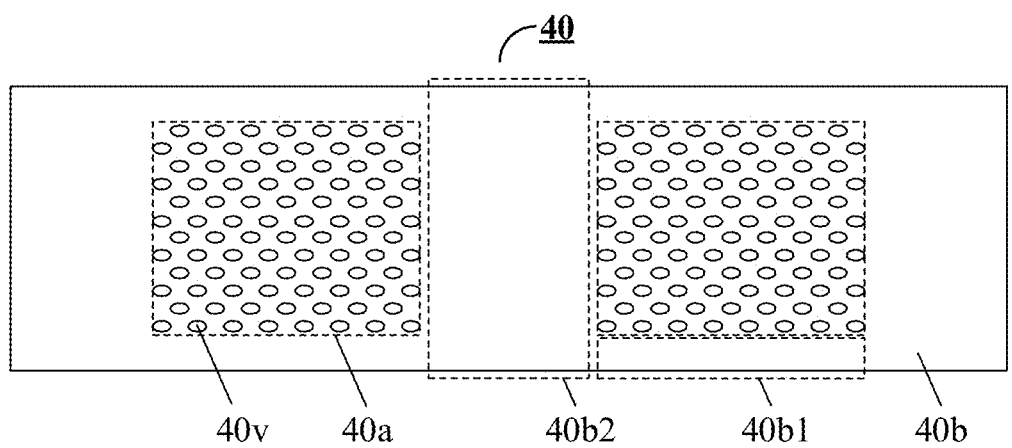
FIG. 2 is a schematic partially enlarged view of a fine metal mask plate in the mask device illustrated in FIG. 1.

FIG. 2 is a schematic partially enlarged view of the fine metal mask plate in the mask device illustrated in FIG. 1. As illustrated in FIG. 2, the fine metal mask plate 40 includes a mask pattern region 40a and a peripheral region 40b. The mask pattern region 40a is full of through holes 40v which are arranged in an array (for example, the through holes 40v are formed by etching, and correspond to the sub-pixels of one or a plurality of display panels to be manufactured), while the peripheral region 40b does not have the through holes 40v. The peripheral region 40b includes a first peripheral region 40b1 corresponding to the shielding strip 20 and a second peripheral region 40b2 corresponding to the supporting strip 30.

With reference to FIG. 1 and FIG. 2, in the case where the mask device 1 is used to evaporate an object to be evaporated (e.g., a substrate of a display panel under preparation), an evaporation material can be deposited in a region to be evaporated (e.g., in sub-pixels of a display panel) of the object to be evaporated through the through holes 40v in the mask pattern region 40a. The shielding strip 20 is located between two adjacent fine metal mask plates 40 and overlaps with the first peripheral region 40b1 of the fine metal mask plates 40, and the shielding strip 20 is used for shielding the evaporation material, so as to prevent the evaporation material from being deposited on the object to be evaporated through the gap between the two adjacent fine metal mask plates 40. The supporting strip 30 is located between two adjacent mask pattern regions 40a of the fine metal mask plate 40 and overlaps with the second peripheral region 40b2 of the fine metal mask plate 40, and the supporting strip 30 is used for supporting the fine metal mask plate 40, so as to reduce the sagging amount of the fine metal mask plate 40, thereby improving the deposition accuracy.

The manufacturing process of the mask device 1 illustrated in FIG. 1 generally includes: preparing the metal frame 10, the shielding strips 20 and the supporting strips 30 by, for example, wire cutting process; preparing the fine metal mask plate 40 by wire cutting process and etching process; soldering the shielding strips 20 and supporting strips 30 on the metal frame 10 in turn; and then tensioning and soldering the fine metal mask plate 40 on the metal frame 10. Because the fine metal mask plate 40 is arranged on the side of the shielding strips 20 and the supporting strips 30 away from the metal frame 10, in order to avoid bending of the fine metal mask plate 40 due to the influence of the thickness of the shielding strip 20 and that of the supporting strip 30 when soldering the fine metal mask plate 40 on the metal frame 10, soldering grooves (not illustrated in FIG. 1) for accommodating the shielding strips 20 and the supporting strips 30 are usually formed on the metal frame 10. For example, the soldering grooves can be located at the overlapping positions of the shielding strips 20 and the metal frame 10 and the overlapping positions of the supporting strips 30 and the metal frame 10 in FIG. 1.

The step of tensioning and soldering the fine metal mask plate 40 on the metal frame 10 is called tension, which is actually a process of spreading and tightening the fine metal mask plate 40. In the fine metal mask plate 40, the central region and the edge region of the mask pattern region 40a have different peripheral morphologies. For example, the periphery of the central region of the mask pattern region 40a still belongs to the mask pattern region 40a, while the periphery of the edge region of the mask pattern region 40a has both a part belonging to the mask pattern region 40a and a part belonging to the peripheral region 40b. In the process of tension, because there are stress differences between the mask pattern region 40a and the peripheral region 40b of the fine metal mask plate 40, the edge region of the mask pattern region 40a has the problem of uneven stress, which easily leads to deformation and wrinkles of the edge region of the mask pattern region 40a due to uneven stress in the process of tension. Therefore, if a light emitting unit is evaporated on a display panel by using the mask device illustrated in FIG. 1, there may be a phenomenon of abnormal color at the inner circumference of the active area (AA) of the display panel when the display panel is lit.

In at least one embodiment of the present disclosure, if the orthographic projection of a mask pattern region on the plane of a corresponding opening is located in the corresponding opening (including the case in which the orthographic projection completely overlaps with the corresponding opening), the whole mask pattern region is referred to as an "effective mask region", and for example, the whole mask pattern region 40a in FIG. 1 is an effective mask region. If the orthographic projection of a part of the mask pattern region on the plane of a corresponding opening is located in the corresponding opening (including the case in which the orthographic projection completely overlaps with the corresponding opening) and the orthographic projection of the rest of the mask pattern region on the plane of the corresponding opening does not overlap with the corresponding opening, this part of the mask pattern region is referred to as an "effective mask region".

At least one embodiment of the present disclosure provides a mask device, which includes: a mask frame; at least one first mask strip extending in a first direction and at least one second mask strip extending in a second direction, which are fixed on the mask frame; and a first mask plate extending in the first direction and fixed on the mask frame, wherein the first direction is intersected with the second direction, and the at least one first mask strip and the at least one second mask strip are intersected with each other to define at least one mask opening. The first mask plate includes a mask pattern region, the mask pattern region includes a plurality of through holes arranged in an array, and the plurality of through holes include a first group of through holes and a second group of through holes. The orthographic projection of the at least one mask opening on the first mask plate covers the first group of through holes in the mask pattern region, and the orthographic projection of the at least one first mask strip and the at least one second mask strip on the first mask plate covers the second group of through holes in the mask pattern region.

Some embodiments of the present disclosure further provide a manufacturing method corresponding to the mask device described above, an evaporation method and a display device.

In the mask device provided by some embodiments of the present disclosure, the mask pattern region of the first mask plate is shielded by the first mask strips and the second mask strips, and a part of the mask pattern region close to the center of the mask pattern region is defined as an effective mask region, and each through hole in the effective mask region has basically the same peripheral morphologies, so that the problems of deformation and wrinkles of the effective mask region due to uneven stress in the process of tension can be avoided, and further, the color mixing of the product can be improved and the yield of the product can be increased.

Some embodiments of the present disclosure and examples thereof will be described in detail with reference to the accompanying drawings.

Figure 3:
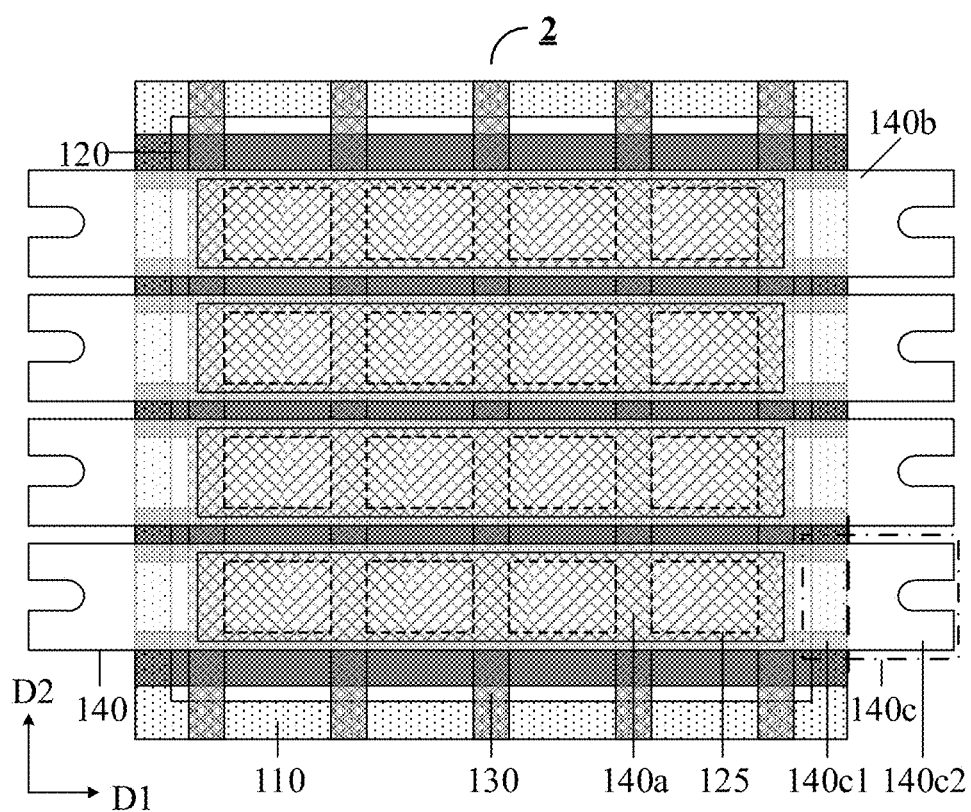
FIG. 3 is a schematic top view of a mask device according to at least one embodiment of the present disclosure.

FIG. 3 is a schematic top view of a mask device according to at least one embodiment of the present disclosure. As illustrated in FIG. 3, the mask device 2 includes a mask frame 110, at least one first mask strip 120, at least one second mask strip 130 and a plurality of first mask plates 140.

For example, in some examples, as illustrated in FIG. 3, the mask frame 110 can be a rectangular frame. Of course, in some other examples, the mask frame 110 can have any other suitable shape, without being limited in the embodiments of the present disclosure. For example, the material of the mask frame 110 can include a metal material with high thermal stability and small thermal expansion coefficient, such as invar alloy, stainless steel, etc., without being limited in the embodiments of the present disclosure.

Figure 4A:
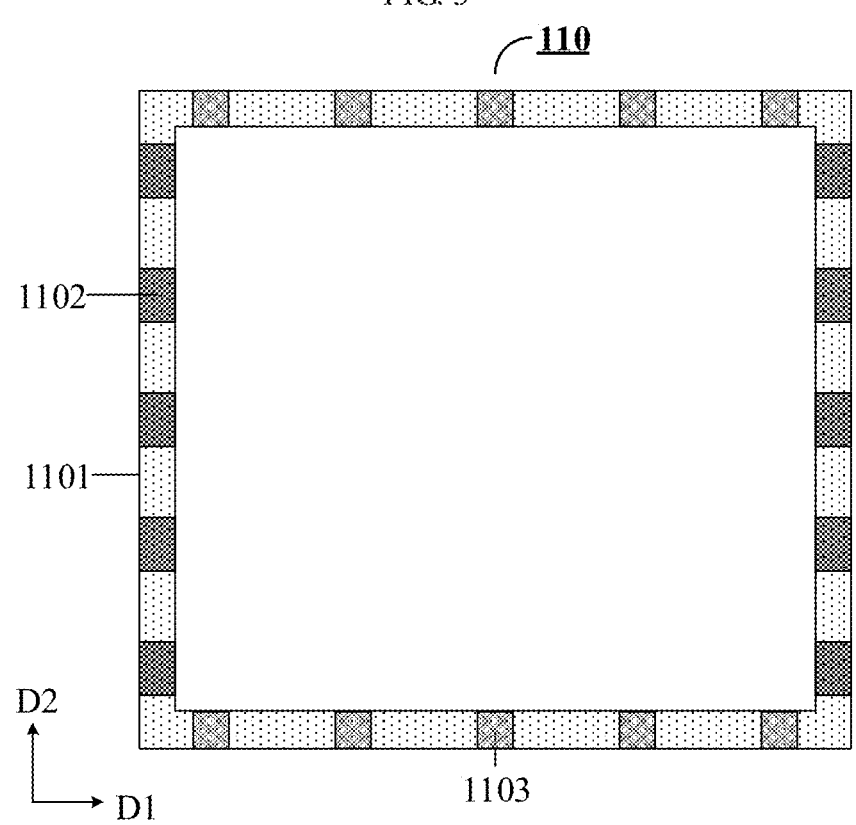
FIG. 4A is a schematic top view of a mask frame in the mask device illustrated in FIG. 3.

FIG. 4A is a schematic top view of the mask frame 110 in the mask device illustrated in FIG. 3. For example, as illustrated in FIG. 4A, the mask frame 110 includes a main surface 1101 and a plurality of grooves 1102 and 1103 (not illustrated in FIG. 3) located on the main surface 1101. For example, the rest part of the main surface 1101 of the mask frame 110 other than the grooves 1102 and 1103 is located in the same plane. For example, as illustrated in FIG. 4A, the grooves 1102 are located on the edges of the mask frame 110 which are intersected with the first direction D1, for accommodating and fixing the first mask strips 120 extending in the first direction D1. The grooves 1103 are located on the edges of the mask frame 110 which are intersected with the second direction D2, for accommodating and fixing the second mask strips 130 extending in the second direction D2. For example, in some examples, the first mask strips 120 are located below the second mask strips 130. In this case, in the direction perpendicular to the main surface 1101 of the mask frame 110, the depth of the groove 1102 is basically equal to or slightly greater than the sum of the thicknesses of the first mask strip 120 and the second mask strip 130, and the depth of the groove 1103 is basically equal to or slightly greater than the thickness of the second mask strip 130, so that the surface of the second mask strip 130 away from the mask frame 110 and the main surface 1101 of the mask frame 110 are basically in the same plane. For example, in the actual manufacturing process, both the dimension of the first mask strip 120 and the dimension of the groove 1102 have certain precision errors, in order to ensure that the dimension of the first mask strip 120 can be completely accommodated and fixed in the corresponding grooves 1102, the width of each groove 1102 can be slightly greater than the width of the corresponding first mask strip 120 in the direction perpendicular to the extending direction of the first mask strip 120. Similarly, in the direction perpendicular to the extending direction of the second mask strip 130, the width of each groove 1103 can be slightly greater than the width of the corresponding second mask strip 130. For example, when using the mask device 2 to evaporate an object to be evaporated, the mask device 2 including the mask frame 110 can be fixed by clamping the positions between adjacent grooves (e.g., the positions between adjacent grooves 1103) of the mask frame 110. It should be noted that the fixing method of the mask device (including the mask device 2 illustrated in FIG. 3 and the mask device 3 illustrated in FIG. 5 which is to be described later) in the evaporation process is not limited in the embodiments of the present disclosure.

For example, as illustrated in FIG. 3, the first mask strips 120 and the second mask strips 130 are fixed on the mask frame 110, wherein the first mask strips 120 extend in the first direction D1 and the second mask strips 130 extend in the second direction D2 and are intersected with the first mask strips 120. For example, the first mask strips 120 and the second mask strips 130 can be fixed (e.g., soldered) on the mask frame 110 via the grooves 1102 and 1103, respectively. For example, the materials of the first mask strip 120 and the second mask strip 130 can include metal materials with high thermal stability and small thermal expansion coefficient, such as invar alloy, stainless steel, etc., without being limited in the embodiments of the present disclosure.

Figure 4B:
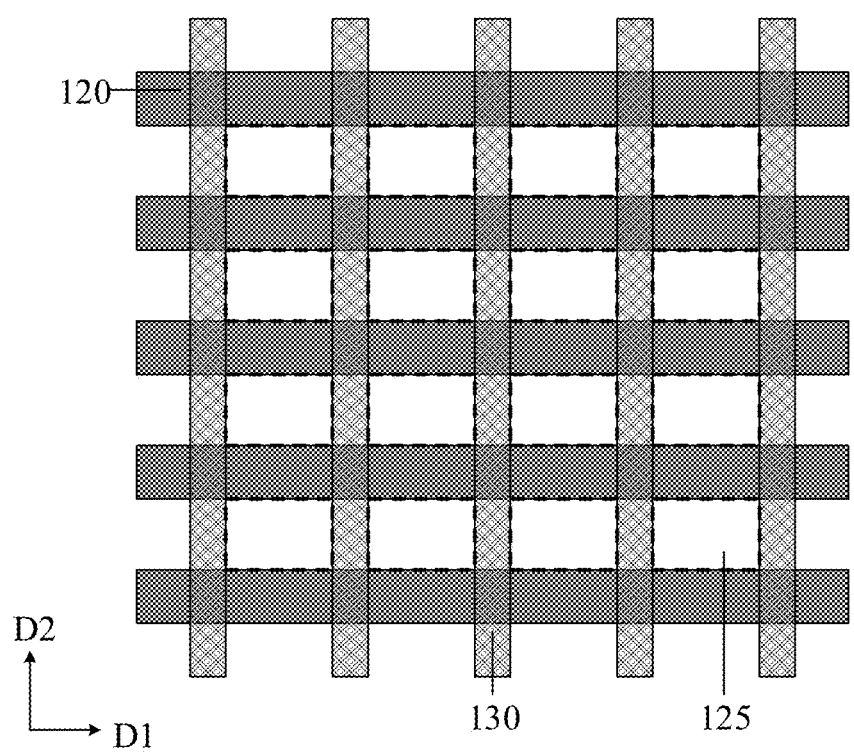
FIG. 4B is a schematic top view of a first mask strip and a second mask strip in the mask device illustrated in FIG. 3.

FIG. 4B is a schematic top view of the first mask strip 120 and the second mask strip 130 in the mask device illustrated in FIG. 3. For example, in some examples, as illustrated in FIG. 3 and FIG. 4B, the first mask strip 120 and the second mask strip 130 are separately arranged, for example, the first mask strip 120 is located below the second mask strip 130, that is, the second mask strip 130 is located on the side of the first mask strip 120 away from the mask frame 110, that is, the first mask strip 120 is fixed on the mask frame 110 first, and then the second mask strip 130 is fixed on the mask frame 110.

As described above, as illustrated in FIG. 3 and FIG. 4B, the first direction D1 is intersected with the second direction D2, so that the first mask strip 120 and the second mask strip 130 are intersected with each other to define at least one mask opening 125 (as illustrated by the dashed box 125 in FIG. 3 and FIG. 4B). For example, in some examples, as illustrated in FIG. 3 and FIG. 4B, the first direction D1 and the second direction D2 can be perpendicular to each other. For example, in some examples, as illustrated in FIG. 3 and FIG. 4B, all of the mask openings 125 are defined by the first mask strips 120 and the second mask strips 130. For example, in some other examples, at least a part of the mask openings 125 (e.g., the mask openings adjacent to the mask frame 110, which are not illustrated in FIG. 3 and FIG. 4B) can also be defined by the first mask strip 120, the second mask strip 130 and the mask frame 110 together. For example, in some examples, as illustrated in FIG. 3 and FIG. 4B, the shape of the mask opening 125 can be a rectangle (belonging to a regular polygon). For example, in some other examples, the shape of the mask opening 125 can be one selected from the group consisting of rectangle, circle, ellipse, sector and polygon (including regular polygon and irregular polygon). That is, the shape of the mask opening is not limited in the embodiments of the present disclosure. It should be noted that the specific shape of the mask opening 125 is related to the shape of the first mask strip 120 and the shape of the second mask strip 130, so the specific shapes of the first mask strip 120 and the second mask strip 130 are not limited in the embodiments of the present disclosure, either. In addition, it should be noted that the size and number of the mask openings 125 are not limited in the embodiments of the present disclosure.

For example, as illustrated in FIG. 3, the first mask plate 140 is fixed on the mask frame 110. For example, in some examples, as illustrated in FIG. 3, the first mask plates 140 are located on one side of the first mask strips 120 and the second mask strips 130 away from the mask frame 110. For example, in some examples, after the second mask strips 130 are soldered on the mask frame 110, the first mask plates 140 are also soldered on the mask frame 110. For example, the material of the first mask plate 140 can include a metal material with high thermal stability and small thermal expansion coefficient, such as invar alloy, stainless steel, etc., without being limited in the embodiments of the present disclosure.

For example, as illustrated in FIG. 3, the first mask plate 140 extends in the first direction D1. For example, in some examples, the surface of the second mask strip 130 close to the first mask plate 140 and the surface of the mask frame 110 close to the first mask plate 140 (i.e., the main surface 1101 of the mask frame 110) are basically in the same plane, so that the second mask strip 130 can support the first mask plate 140 to reduce the sagging amount of the first mask plate 140, thereby improving the deposition accuracy.

Figure 4C:
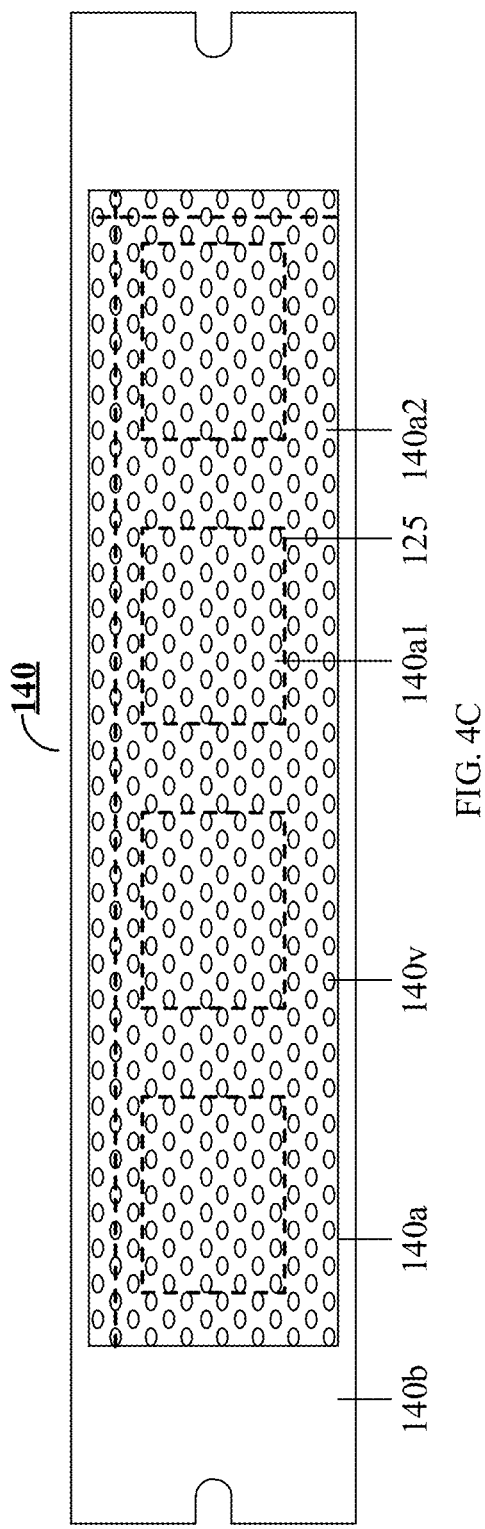
FIG. 4C is a schematic enlarged view of a first mask plate in the mask device illustrated in FIG. 3.

For example, as illustrated in FIG. 3, the first mask plate 140 includes a mask pattern region 140a and a peripheral region 140b surrounding the mask pattern region 140a. FIG. 4C is a schematic enlarged view of the first mask plate 140 in the mask device 2 illustrated in FIG. 3.

It should be noted that in the embodiments of the present disclosure and actual applications, the mask pattern region is artificially defined in general. For example, the mask pattern region is generally defined as having a shape similar to the shape formed by the sequential connection of the outermost through holes (e.g., the central connection of the through holes) among the plurality of through holes on the first mask plate. For example, the mask pattern region is a shape which exactly includes the plurality of through holes described above and has a minimum area. It should be noted that the shape and size of the mask pattern region are not specifically limited in the embodiments of the present disclosure.

For example, as illustrated in FIG. 4C, the mask pattern region 140a includes a plurality of through holes 140v arranged in an array, while the peripheral region 140b does not include the through hole 140v. For example, in some examples, as illustrated in FIG. 4C, the mask pattern region 140a is a rectangular region which has the smallest area and includes the plurality of through holes 140v, that is, the through holes 140v are arranged all over the mask pattern region 140a. For example, the plurality of through holes 140v are uniformly distributed in the mask pattern region 140a. For example, the through holes 140v are periodically distributed in the mask pattern region 140a. For example, the plurality of through holes 140v have the same shape and the same size. For example, the shapes of the plurality of through holes 140v include but are not limited to rectangle, diamond, circle, hexagon, etc. It should be noted that the shape and size of the through hole 140v are not specifically limited in the embodiments of the present disclosure. It should also be noted that the specific shape of the mask pattern region 140a is not limited in the embodiments of the present disclosure.

For example, as illustrated in FIG. 3 and FIG. 4C, the mask pattern region 140a includes an effective mask region 140a1 defined by the at least one mask opening 125 in the first direction D1 (a part of the mask pattern region 140a located within the dashed box 125 in FIG. 4C). For example, as illustrated in FIG. 3, the orthographic projection of the at least one mask opening 125 in the first direction D1 on the first mask plate 140 covers a part of the mask pattern region 140a of the first mask plate 140 (i.e., a region of the mask pattern region 140a within the dashed box 125 in FIG. 4C), this part of the mask pattern region 140a is the effective mask region 140a1. For example, the effective mask region 140a1 is located within the mask pattern region 140a of the first mask plate 140. For example, the effective mask region 140a1 is away from the edges of the mask pattern region 140a of the first mask plate 140, that is, close to the center of the mask pattern region 140a of the first mask plate 140. For example, the through holes 140v included in the effective mask region 140a1 are referred to as a first group of through holes. In the case where the mask device 2 is used to evaporate an object to be evaporated (e.g., a substrate of a display panel under preparation), an evaporation material can be deposited in a region to be evaporated of the object to be evaporated (e.g., a sub-pixel of a display panel) through the first group of through holes.

For example, as illustrated in FIG. 3 and FIG. 4C, the orthographic projection of the first mask strips 120 and the second mask strips 130 on the first mask plate 140 covers another region 140a2 of the mask pattern region 140a of the first mask plate 140 other than the effective mask region 140a1 (i.e., the region of the mask pattern region 140a located at the outer side of the dashed box 125 in FIG. 4C), and the another region 140a2 is referred to as a dummy region. That is, the mask pattern region 140a further includes the dummy region 140a2. For example, the through holes 140v included in the dummy region 140a2 are referred to as a second group of through holes. When an object to be evaporated (e.g., a display panel) is evaporated by using the mask device 2, the second group of through holes are blocked by the first mask strips 120 and the second mask strips 130, so that the evaporation material cannot be deposited in the region to be evaporated (e.g., in the sub-pixels of the display panel) of the object to be evaporated through the second group of through holes.

For example, as illustrated in FIG. 4C, the plurality of through holes in the mask pattern region 140a of the first mask plate 140 include the first group of through holes and the second group of through holes. In the mask pattern region 140a of the first mask plate 140, the dummy region 140a2 surrounds the effective mask region 140a1, so that the second group of through holes included in the dummy region 140a2 surround the first group of through holes included in the effective mask region 140a1. It should be noted that, in the embodiments of the present disclosure, "surrounding" is not limited to the case of full enclosing, but can also include the case of half enclosing.

For example, as illustrated in FIG. 4C, the spacing between two adjacent through holes of the first group of through holes included in the effective mask region 140a1, the spacing between two adjacent through holes of the second group of through holes included in the dummy region 140a2, and the spacing between one through hole of the first group of through holes and one through hole of the second group of through holes adjacent to the one through hole of the first group of through holes, are equal. For example, in the whole mask pattern region 140a, all the through holes are periodically and uniformly arranged. For example, as illustrated in FIG. 4C, the region in which the first group of through holes are located (i.e., the effective mask region 140a1) and the region in which the second group of through holes are located (i.e., the dummy region 140a2) are continuous and together form a rectangular mask pattern region 140a.

For example, as illustrated in FIG. 4C, the mask pattern region 140a includes a plurality of first regions arranged in the first direction (for example, the first regions belong to the effective mask region 140a1), and the first group of through holes are arranged in the first regions. The mask pattern region 140a further includes a plurality of second regions (for example, the second regions belong to the dummy region 140a2) respectively surrounding the plurality of first regions, and the second group of through holes are arranged in the second regions. For example, as illustrated in FIG. 4C, each of the first regions is rectangular and each of the second regions is rectangular ring shaped.

For example, as illustrated in FIG. 3, the peripheral region 140b of the first mask plate 140 can further include an original end portion 140c (as illustrated by the dashed box 140c in FIG. 3). For example, as illustrated in FIG. 3, the original end portion 140c includes an end portion 140c1 and a clamping portion 140c2 (as illustrated by two portions, separated by dashed lines, of the dashed box 140c in FIG. 3). For example, the original end portions 140c (i.e., the end portion 140c1 and the clamping portion 140c2) are located on two sides of the mask pattern region 140a in the first direction D1. For example, the end portion 140c1 includes an edge that is flush with an outer edge of the mask frame 110 (as illustrated by the dashed line which divides the dashed box 140c into 140c1 and 140c2 in FIG. 3), and the orthographic projection of the clamping portion 140c2 on the plane of the mask frame 110 is located at an outer side of the mask frame 110. For example, in some examples, in the manufacturing process of the mask device 2, a tension machine performs a tensioning operation on the first mask plate 140 by clamping the clamping portion 140c2. For example, in some examples, after the tensioning operation is completed, the original end 140c of the first mask plate 140 can be cut, for example, along the outer edge of the mask frame 110 (as illustrated by the dashed line which divide the dashed box 140c into 140c1 and 140c2 in FIG. 3), so as to remove the clamping portion 140c2 and retain the end portion 140c1, and thus, the end portion 140c1 has an edge flush with the outer edge of the mask frame 110. For example, the first mask plate 140 is fixed (e.g., soldered) onto the mask frame 110 through the end portion 140c1.

For example, in the case where the mask device 2 is used to evaporate the object to be evaporated (e.g., the substrate of the display panel under preparation), the evaporation material can be deposited in the region to be evaporated (e.g., in the sub-pixels of the display panel) of the object to be evaporated through the first group of through holes 140v in the effective mask region 140a, and for example, the size of the effective mask region 140a is equal to or slightly greater than that of the region to be evaporated. For example, as illustrated in FIG. 3, the first mask strip 120 can shield the second group of through holes 140v in the edge portion of the dummy region 140a2 parallel to the first direction D1, so as to prevent the evaporation material from being deposited on the object to be evaporated through the second group of through holes 140v in the edge portion of the dummy region 140a2 parallel to the first direction D1. For example, as illustrated in FIG. 3, in the case where the mask device 2 includes a plurality of first mask plates 140, the orthographic projection of the gap between adjacent first mask plates 140 on the first mask strip 120 is located within the first mask strip 120, so that the first mask strip 120 can also shield the gap between adjacent first mask plates 140, so as to prevent the evaporation material from being deposited on the object to be evaporated through the gap between adjacent first mask plates 140 (referring to the function of the shielding strip 20 in the mask device 1 illustrated in FIG. 1).

For example, as illustrated in FIG. 3, the second mask strip 130 can shield the second group of through holes 140v in the portion of the dummy region 140a2 parallel to the second direction D2 and located between adjacent effective mask regions 140a1, so as to prevent the evaporation material from being deposited on the object to be evaporated through the second group of through holes 140v in the portion of the dummy region 140a2 parallel to the second direction D2 and located between adjacent effective mask regions 140a1. For example, as illustrated in FIG. 3, the second mask strip 130 can also shield the second group of through holes 140v in the edge portion of the dummy region 140a2 parallel to the second direction D2, so as to prevent the evaporation material from being deposited on the object to be evaporated through the second group of through holes 140v in the edge portion of the dummy region 140a2 parallel to the second direction D2. For example, the second mask strip 130 can also be used to support the first mask plate 140, so as to reduce the sagging amount of the first mask plate 140 (referring to the function of the supporting strip 30 in the mask device 1 illustrated in FIG. 1), thereby improving the deposition accuracy.

It should be noted that the number of the first mask strips 120, the number of the second mask strips 130 and the number of the first mask plates 140 included in the mask device 2 illustrated in FIG. 3, are all exemplary, without being limited in the embodiments of the present disclosure.

Figure 5:
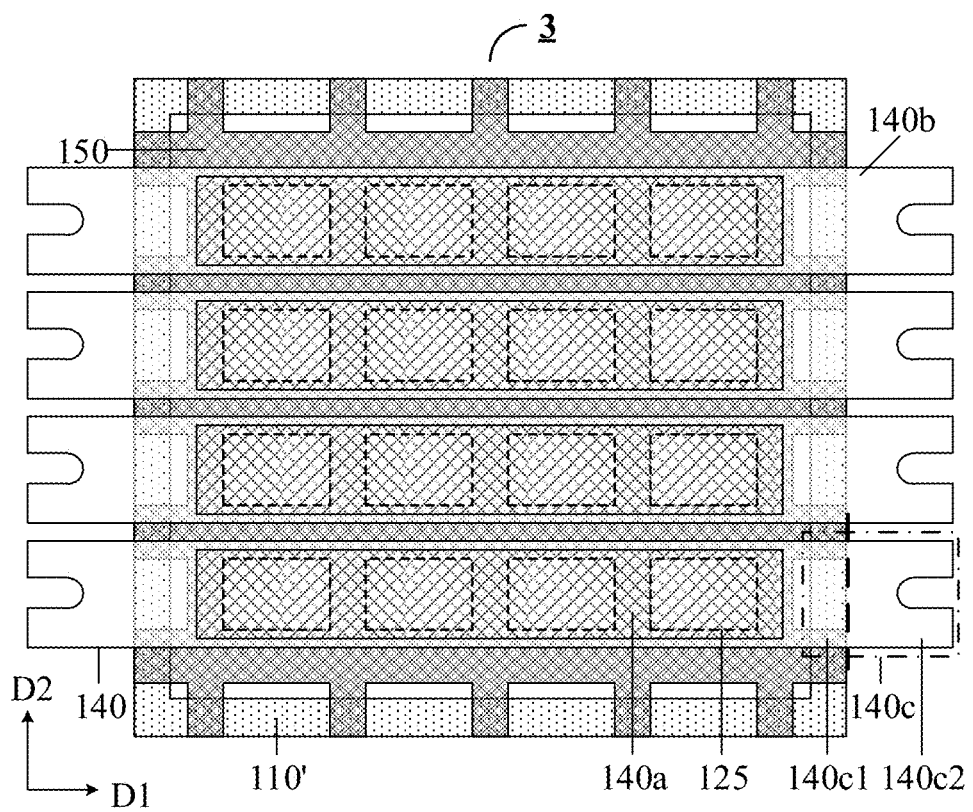
FIG. 5 is a schematic structural diagram of another mask device according to at least one embodiment of the present disclosure.

FIG. 5 is a schematic structural diagram of another mask device provided by at least one embodiment of the present disclosure. The mask device 3 illustrated in FIG. 5 differs from the mask device 2 illustrated in FIG. 3 mainly in that: in the mask device 2 illustrated in FIG. 3, the first mask strip 120 and the second mask strip 130 are separately arranged, while in the mask device 3 illustrated in FIG. 5, the first mask strip and the second mask strip can be integrally arranged (for example, the first mask strips and the second mask strips are formed to be the second mask plate 150 to be described later). For example, the first mask strips and the second mask strip can be integrally arranged to form a mesh structure, and the embodiments of the present disclosure include but are not limited to this case. Hereinafter, the differences between the mask device 3 illustrated in FIG. 5 and the mask device 2 illustrated in FIG. 3 will be described in detail with reference to FIG. 6A and FIG. 6B. It should be noted that other structures of the mask device 3 illustrated in FIG. 5 are basically the same as those of the mask device 2 illustrated in FIG. 3, and details thereof are not repeated here.

For example, as illustrated in FIG. 5, the mask device 3 includes a mask frame 110', a second mask plate 150, and a first mask plate 140. For example, the first mask plate 140 in the mask device 3 illustrated in FIG. 5 can be referred to the first mask plate 140 in the mask device 2 illustrated in FIG. 3, and can also be referred to the first mask plate 140 illustrated in FIG. 4C, and details thereof will not be repeated here.

Figure 6A:
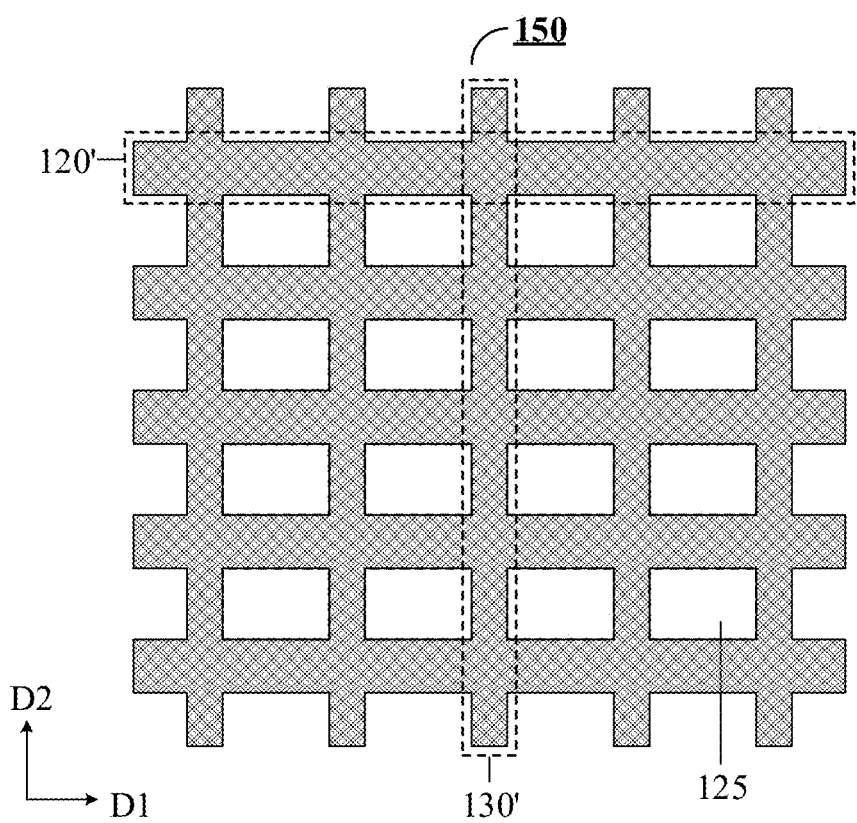
FIG. 6A is a schematic top view of a second mask plate in the mask device illustrated in FIG. 5.

FIG. 6A is a schematic top view of the second mask plate 150 in the mask device illustrated in FIG. 5. For example, as illustrated in FIG. 6A, the second mask plate 150 includes at least one mask opening 125 (corresponding to the mask opening 125 in FIG. 3). For example, the extending strips extending in the first direction D1 on the second mask plate 150 (as illustrated by the dashed box 120' in FIG. 6A) can be regarded as the first mask strips 120, and the extending strips extending in the second direction D2 on the second mask plate 150 (as illustrated by the dashed box 130' in FIG. 6A) can be regarded as the second mask strips 130. For example, the material of the second mask plate 140 can include a metal material with high thermal stability and small thermal expansion coefficient, such as invar alloy, stainless steel, etc., without being limited in the embodiments of the present disclosure.

The second mask plate 150 can be used to shield the through holes 140v in the dummy region 140a2 of the first mask plate 140 and the gap between adjacent first mask plates 140, and can also be used to support the first mask plate 140. For example, the second mask plate 150 can be arranged on the mask frame 110', while the first mask plate 140 is arranged on the side of the second mask plate 150 away from the mask frame 110'. For example, the orthographic projection of the second mask plate 150 on the plane of the mask frame 110' in FIG. 6A is basically the same as the orthographic projection of the first mask strips 120 and the second mask strips 130 on the plane of the mask frame 110 in FIG. 3, and the embodiments of the present disclosure include but are not limited to this case.

Figure 6B:
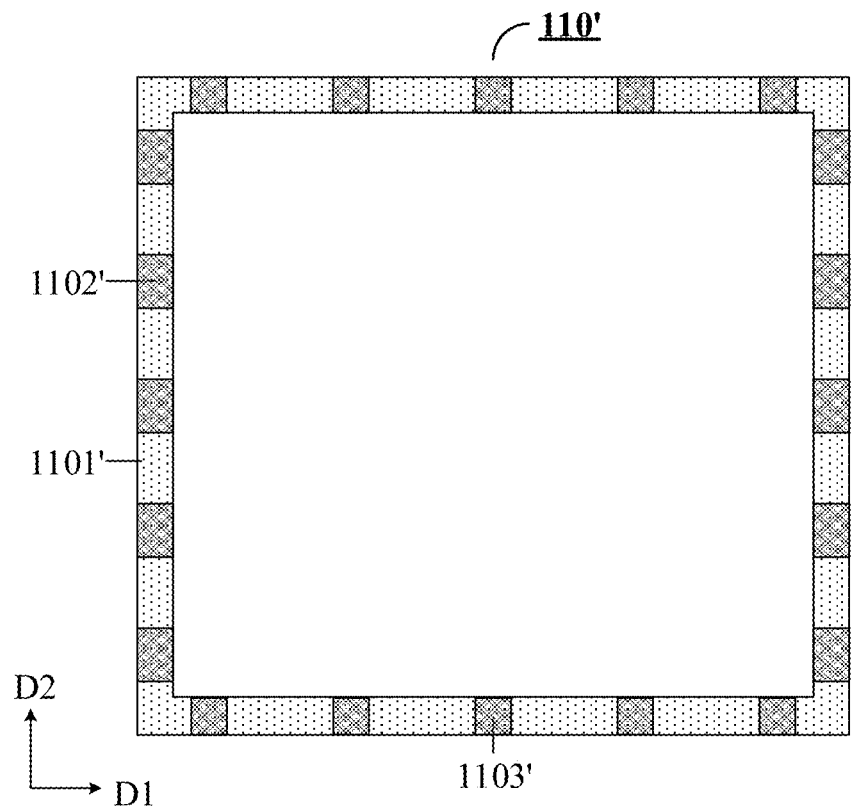
FIG. 6B is a schematic top view of a mask frame in the mask device illustrated in FIG. 5.

FIG. 6B is a schematic top view of the mask frame 110' in the mask device illustrated in FIG. 5. For example, as illustrated in FIG. 6B, the mask frame 110' includes a main surface 1101' and a plurality of grooves 1102' and 1103' (not illustrated in FIG. 5) located on the main surface 1101'. For example, the rest part of the main surface 1101' of the mask frame 110' other than the grooves 1102' and 1103' is located in the same plane. For example, as illustrated in FIG. 6B, the grooves 1102' are located on the edges of the mask frame 110' which are intersected with the first direction D1, for accommodating and fixing the extending strips of the second mask plate 150 extending in the first direction D1 (as illustrated by the dashed box 120' in FIG. 6A). The grooves 1103' are located on the edge of the mask frame 110' which are intersected with the second direction D2, for accommodating and fixing the extending strips of the second mask plate 150 extending in the second direction D2 (as illustrated by the dashed box 130' in FIG. 6A). Different from the mask frame 110 illustrated in FIG. 4A, in the mask frame 110' illustrated in FIG. 6B, in the direction perpendicular to the main surface 1101' of the mask frame 110', the depths of the grooves 1102' and 1103' are basically the same and the depths of the grooves 1102' and 1103' are basically equal to or slightly greater than the thickness of the second mask plate 150, so that the surface of the second mask plate 150 away from the mask frame 110' is basically in the same plane as the main surface 1101' of the mask frame 110'. For example, other details of the mask frame 110' illustrated in FIG. 6B can be referred to the related description of the mask frame 110 illustrated in FIG. 4A, and will not be repeated here.

It should be noted that the shape of the second mask plate 150 illustrated in FIG. 5 is exemplary, and the specific shape of the second mask plate 150 is not limited in the embodiments of the present disclosure, as long as the second mask plate 150 includes a suitable mask opening 125 and the mask pattern region 140a of the first mask plate 140 can be appropriately shielded (that is, the dummy region 140a2 in the mask pattern region 140a can be shielded). In addition, the embodiments of the present disclosure do not limit whether the second mask plate 150 is fixed on the mask frame 110' through the grooves. For example, the second mask plate 150 can also be directly fixed on the main surface of the mask frame 110'.

In summary, in the mask device provided by the embodiments of the present disclosure, the first mask strips and the second mask strips (or the second mask plate) can be fixed on the mask frame in an appropriate way according to specific situations, and the appropriate way is not limited to the various ways in the above embodiments.

In the mask device provided by the embodiments of the present disclosure, the mask pattern region 140a of the first mask plate 140 is shielded by the first mask strips 120 and the second mask strips 130, and a part of the mask pattern region close to the center of the mask pattern region 140a is defined as an effective mask region 140a1. Because each through hole 140v in the effective mask region 140a1 has basically the same peripheral morphologies, the effective mask region 140a1 can be uniformly stressed in the process of tension, so that the problems of deformation and wrinkles of the effective mask region due to uneven stress in the process of tension can be avoided, and further, the color mixing of the product can be improved and the yield of the product can be increased.

For example, as illustrated in FIG. 4C, in order to ensure that each through hole 140v in the effective mask region 140a has basically the same peripheral morphologies, the size of the mask pattern region 140a in each direction is greater than that of the effective mask region 140a1 in the each direction. Because the effective mask region 140a1 is defined by the mask opening 125, the size of the mask pattern region 140a in each direction is greater than that of the mask opening 125 in the each direction. For example, in some examples, as illustrated in FIG. 4C, the plurality of through holes in the mask pattern region 140a are arranged in the first direction D1 to form a plurality of through hole rows (as illustrated by dashed lines in the first direction D1 in FIG. 4C), and a region between the edge of the dummy region 140a2 parallel to the first direction D1 and the effective mask region 140a1 includes at least three through hole rows, that is, the orthographic projection of the first mask strip 120 on the first mask plate 140 covers at least three through hole rows. For example, the orthographic projection of the first mask strip 120 on the first mask plate 140 can cover 3, 4, 5 or more through hole rows, without being limited in the embodiments of the present disclosure. For example, in some examples, as illustrated in FIG. 4C, the plurality of through holes in the mask pattern region 140a are arranged in the second direction D2 to form a plurality of through hole columns (as illustrated by the dashed line in the second direction D2 in FIG. 4), and both a region between the edge of the dummy region 140a2 parallel to the second direction D2 and the effective mask region 140a1 and a region of the dummy region 140a2 between the adjacent effective mask regions 140a1 include at least three through hole columns, that is, the orthographic projection of the second mask strip 130 on the first mask plate 140 covers at least three through hole columns. For example, the orthographic projection of the second mask strip 130 on the first mask plate 140 can cover 3, 4, 5 or more through hole columns, without being limited in the embodiments of the present disclosure. For example, in some examples, as illustrated in FIG. 4C, the effective mask regions 140a1 are symmetrically distributed in the mask pattern region 140a. For example, in some examples, a connection line between the center of the effective mask region 140a1 and the center of the mask pattern region 140a is parallel to the first direction D1, or the center of the effective mask region 140a1 coincides with the center of the mask pattern region 140a.

It should be noted that, in the embodiments of the present disclosure, "row" and "column" are not intended to define directions, forms, etc., but only to describe a group of through holes in the first direction or the second direction for convenience. For example, the connection line of the centers of the group of through holes is basically parallel to the first direction or the second direction, but it is not required that the connection line of the centers of the group of through holes is strictly parallel to the first direction or the second direction; also, it is not required that the connection line of the centers of the group of through holes must be a straight line.

At least one embodiment of the present disclosure further provides a manufacturing method of a mask device. The mask device provided by the above embodiments of the present disclosure (e.g., the mask device 2 illustrated in FIG. 3 and the mask device 3 illustrated in FIG. 5) can be manufactured by the manufacturing method. The manufacturing method of the mask device provided by the embodiments of the present disclosure will be described in detail with reference to FIG. 3, FIG. 4C and FIG. 5.

For example, the manufacturing method includes the following steps S101-S102. Before the following steps, for example, a mask frame, a first mask strip, a second mask strip, a first mask plate, etc., can be obtained by a machining process (such as cutting, stamping, etc.), and if necessary, by an etching process together.

Step S101: fixing at least one first mask strip and at least one second mask strip on a mask frame, wherein the at least one first mask strip extends in a first direction and the at least one second mask strip extends in a second direction, the first direction is intersected with the second direction, and the at least one first mask strip and the at least one second mask strip are intersected with each other to define at least one mask opening.

For example, in some examples, as illustrated in FIG. 3, the first mask strip 120 and the second mask strip 130 are separately arranged. Therefore, the fixing the at least one first mask strip and the at least one second mask strip on the mask frame includes: fixing the first mask strip 120 on the mask frame 110 first, and then fixing the second mask strip 130 on the mask frame 110, wherein the second mask strip 130 is located on a side of the first mask strip 120 away from the mask frame 110. For example, the way of fixing the first mask strip 120 and the second mask strip 130 on the mask frame 110 includes soldering. For example, a plurality of soldering grooves for fixing the first mask strip 120 and the second mask strip 130 can be formed on the mask frame 110, and the first mask strip 120 and the second mask strip 130 are respectively soldered on the mask frame 110 through the soldering grooves.

For example, in some other examples, as illustrated in FIG. 5, the first mask strip and the second mask strip are integrally arranged, that is, the first mask strip and the second mask strip are formed as a second mask plate 150, wherein an extending strip of the second mask plate 150 extending in the first direction D1 can be regarded as the first mask strip 120, an extending strip of the second mask plate 150 extending in the second direction D2 can be regarded as the second mask strip 130, and the second mask plate 150 includes at least one mask opening 125. Therefore, the fixing the at least one first mask strip and the at least one second mask strip on the mask frame includes: fixing the second mask plate 150 on the mask frame 110. For example, the way of fixing the second mask plate 150 on the mask frame 110 includes soldering. For example, soldering grooves for fixing the second mask plate 150 can be formed on the mask frame 110, and the second mask plate 150 is soldered on the mask frame 110 through the soldering grooves. For another example, the second mask plate 150 can be directly soldered on the surface of the mask frame 110, without being limited in the embodiments of the present disclosure.

It should be noted that more details (e.g., shape, size, number and arrangement, etc.) of the mask frame, the first mask strip, the second mask strip and the second mask plate can be referred to the relevant descriptions in the above embodiments of the mask device, and will not be repeated here.

Step S102: fixing a first mask plate on the mask frame, wherein the first mask plate extends in the first direction, the first mask plate includes a mask pattern region, the mask pattern region includes a plurality of through holes arranged in an array, the plurality of through holes include a first group of through holes and a second group of through holes, an orthographic projection of the at least one mask opening on the first mask plate covers the first group of through holes in the mask pattern region, and an orthographic projection of the at least one first mask strip and the at least one second mask strip on the first mask plate covers the second group of through holes in the mask pattern region.

For example, in some examples, the first mask plate can be the first mask plate 140 illustrated in FIG. 4C, and the embodiments of the present disclosure include but are not limited to this case. For example, as illustrated in FIG. 4C, the first mask plate 140 includes a mask pattern region 140a, and the mask pattern region 140a includes a plurality of through holes 140v arranged in an array.

For example, in some examples, as illustrated in FIG. 3, the fixing the first mask plate on the mask frame includes: fixing the first mask plate 140 on a side of the first mask strip 120 and the second mask strip 130 away from the mask frame 110. For example, the first mask plate 140 is fixed on the mask frame 110 by soldering.

For example, in some other examples, as illustrated in FIG. 5, the fixing the first mask plate on the mask frame includes: fixing the first mask plate 140 on one side of the second mask plate 150 (the first mask strip and the second mask strip are integrally formed to be the second mask plate 150) away from the mask frame 110. For example, the first mask plate 140 is fixed on the mask frame 110 by soldering.

For example, in step S102, it is also necessary to ensure that the orthographic projection of the mask opening 125 on the first mask plate 140 covers a part of the mask pattern region 140a (e.g., the effective mask region 140a1 illustrated in FIG. 4C), and that the orthographic projection of the first mask strip 120 and the second mask strip 130 on the first mask plate 140 covers another part of the mask pattern region 140a other than the effective mask region 140a1 (e.g., the dummy region 140a2 as illustrated in FIG. 4C). For example, as illustrated in FIG. 4C, the dummy region 140a2 surrounds the effective mask region 140a1. For example, the through holes 140v included in the effective mask region 140a1 are referred to as a first group of through holes, and the through holes 140v included in the dummy region 140a2 are referred to as a second group of through holes, so that the plurality of through holes in the mask pattern region 140a include the first group of through holes and the second group of through holes, and for example, the second group of through holes surround the first group of through holes.

It should be noted that more details of the first mask plate (including the end portion of the first mask plate, the shape of the mask pattern region, etc.) can be referred to the relevant descriptions in the above embodiments of the mask device, and will not be repeated here.

Technical effects of the manufacturing method of the mask device provided by the embodiments of the present disclosure can be referred to the related description of the mask device in the above embodiments, and will not be repeated here.

Figure 7:
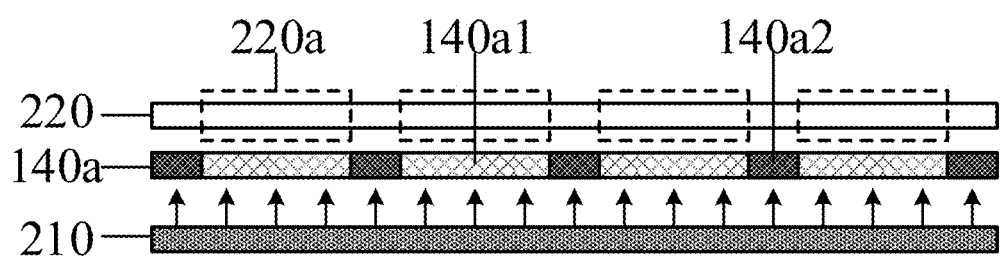
FIG. 7 is a schematic diagram of an evaporation method according to at least one embodiment of the present disclosure.

At least one embodiment of the present disclosure further provides an evaporation method, which includes evaporating an object to be evaporated by using the mask device provided by any one of the above embodiments (e.g., the mask device 2 illustrated in FIG. 3 or the mask device 3 illustrated in FIG. 5) as a mask. FIG. 7 is a schematic diagram of an evaporation method according to at least one embodiment of the present disclosure. It should be noted that, for clarity and conciseness, the mask device in FIG. 7 merely shows the mask pattern region 140a of the first mask plate in the mask device, and does not show other structures of the mask device.

For example, as illustrated in FIG. 7, in the case where the evaporation method is adopted for evaporation, an evaporation source 210 is located at one side of the mask device (e.g., at the side of the mask frame 110 away from the first mask plate 140), and an object 220 to be evaporated (e.g., a substrate to be evaporated, on which a driving circuit structure such as a driving circuit array is formed) is located at the other side of the mask device (e.g., at the side of the first mask plate 140 away from the mask frame 110). The evaporation direction of the evaporation source 210 (as illustrated by the arrow in FIG. 7) faces the mask device and the object 220 to be evaporated.

For example, as illustrated in FIG. 7, the object 220 to be evaporated includes at least one region 220a to be evaporated, and the at least one region 220a to be evaporated corresponds to the at least one effective mask region 140a1, that is, corresponds to the at least one mask opening 125 (referring to FIG. 3, FIG. 4C and FIG. 5). The mask opening 125 exposes the corresponding region 220a to be evaporated, that is, the size of the mask opening 125 is equal to or slightly greater than that of the region 220a to be evaporated, and that is, the size of the effective mask region 140a1 is equal to or slightly greater than that of the region 220a to be evaporated. For example, the shape of the mask opening 125 corresponds to the shape of the region 220a to be evaporated. For example, the shape of the mask opening 125 is designed according to the shape of the region 220a to be evaporated. For example, the mask opening of the mask device can generally be adjusted according to the requirements of product design.

For example, in the evaporation process, the evaporation material emitted by the evaporation source 210 can be deposited in the region 220a to be evaporated of the object 220 to be evaporated through the through holes 140v (i.e., the first group of through holes) in the effective mask region 140a. Because the dummy region 140a2 is shielded by the first mask strip 120 and the second mask strip 130 (or shielded by the second mask plate 150), the evaporation material cannot be deposited on the object 220 to be evaporated through the through holes 140v (i.e., the second group of through holes) in the dummy region 140a2.

For example, in some examples, using the evaporation method to evaporate the object 220 to be evaporated includes forming at least one functional layer of a light emitting element on the object 220 to be evaporated by evaporation. For example, the at least one functional layer of the light emitting element corresponds to at least part of the through holes 140v of the effective mask region 140a1, that is, the at least one functional layer of the light emitting element is formed in the region to be evaporated of the object 220 to be evaporated. For example, the light emitting element can include an organic light emitting element, and for example, the at least one functional layer of the light emitting element can include, but is not limited to, an electron injection layer, an electron transport layer, a light emitting layer, a hole transport layer or a hole injection layer, etc. For example, the pattern of the at least one functional layer formed by evaporation is approximately the same as the pattern of each of the first group of through holes. Specifically, the pattern of each functional layer is approximately the same as the pattern of the corresponding through hole, and the entire pattern of the at least one functional layer is approximately the same as the entire pattern of the first group of through holes.

For example, in some examples, as illustrated in FIG. 7, the mask device includes a plurality of effective mask regions 140a1, and correspondingly, the object 220 to be evaporated (e.g., a substrate to be evaporated) includes a plurality of regions 220a to be evaporated. After the evaporation process is completed, the object 220 to be evaporated can be cut to obtain, for example, a plurality of display substrates, wherein each display substrate includes one of the regions 220a to be evaporated which have been evaporated. For example, based on the display substrate, a display panel or the like can be further manufactured, without being limited in the embodiments of the present disclosure.

Technical effects of the evaporation method provided by the embodiments of the present disclosure can be referred to the related description of the mask device in the above embodiments, and will not be repeated here.

For example, at least one embodiment of the present disclosure further provides a display device, which includes a light emitting element formed by the evaporation method according to any one of the above embodiments of the present disclosure. For example, the display device can include the aforementioned display substrate, without being limited in the embodiments of the present disclosure.

For example, the display device provided by the above embodiments of the present disclosure can be any product or component having a display function, such as a display substrate, a display panel, a display, a television, an electronic paper display device, a mobile phone, a tablet computer, a notebook computer, a digital photo frame, a navigator, etc. It should be noted that the display device described above can further include other conventional components or structures. For example, in order to realize the necessary functions of the display device, those skilled in the art can set other conventional components or structures according to specific application scenarios, without being limited in the embodiments of the present disclosure.

Technical effects of the display device provided by the embodiments of the present disclosure can be referred to the related description of the mask device in the above embodiments, and will not be repeated here.

For the disclosure, the following statements should be noted:

(1) The accompanying drawings related to the embodiment(s) of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or the size of a structure may be enlarged or narrowed, that is, the drawings are not drawn in a real scale.

(3) In case of no conflict, the embodiments of the present disclosure and the features in the embodiments can be combined with each other to obtain new embodiments.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A mask device, comprising:
a mask frame;
at least one first mask strip extending in a first direction and at least one second mask strip extending in a second direction, which are fixed on the mask frame; and
a first mask plate extending in the first direction and fixed on the mask frame;
wherein the first direction is intersected with the second direction, the at least one first mask strip and the at least one second mask strip are intersected with each other to define at least one mask opening,
the first mask plate comprises a mask pattern region, the mask pattern region comprises a plurality of through holes arranged in an array, the plurality of through holes comprise a first group of through holes and a second group of through holes,
an orthographic projection of the at least one mask opening on the first mask plate covers the first group of through holes in the mask pattern region, and an orthographic projection of the at least one first mask strip and the at least one second mask strip on the first mask plate covers the second group of through holes in the mask pattern region.

2. The mask device according to claim 1, wherein the second group of through holes surround the first group of through holes.

3. The mask device according to claim 1, wherein the first mask plate is on one side of the at least one first mask strip and the at least one second mask strip away from the mask frame.

4. The mask device according to claim 1, wherein the plurality of through holes are uniformly distributed in the mask pattern region.

5. The mask device according to claim 1, wherein in the first direction and the second direction, a spacing between two adjacent through holes of the first group of through holes, a spacing between two adjacent through holes of the second group of through holes, and a spacing between one through hole of the first group of through holes and one through hole of the second group of through holes adjacent to the one through hole of the first group of through holes, are equal.

6. The mask device according to claim 1, wherein a region in which the first group of through holes are located and a region in which the second group of through holes are located are continuous and together form a rectangular mask pattern region.

7. The mask device according to claim 1, wherein the mask pattern region comprises a plurality of first regions arranged in the first direction, the first group of through holes are arranged in the plurality of first regions, the mask pattern region further comprises a plurality of second regions respectively surrounding the plurality of first regions, the second group of through holes are arranged in the plurality of second regions, each of the plurality of first regions is rectangular, and each of the plurality of the second regions is rectangular ring shaped.

8. The mask device according to wherein the plurality of through holes are the same in shape and size.

9. The mask device according to claim 1, wherein the plurality of through holes are arranged in the first direction to form a plurality of through hole rows, and
an orthographic projection of each of the at least one first mask strip on the first mask plate covers at least three of the plurality of through hole rows.

10. The mask device according to claim 1, wherein the plurality of through holes are arranged in the second direction to form a plurality of through hole columns, and
an orthographic projection of each of the at least one second mask strip on the first mask plate covers at least three of the plurality of through hole columns.

11. The mask device according to claim 1, wherein the mask device comprises a plurality of the first mask plates, and
an orthographic projection of a gap between two adjacent first mask plates on the first mask strip is within the first mask strip.

12. The mask device according to claim 1, wherein the at least one first mask strip and the at least one second mask strip are arranged separately or integrally.

13. The mask device according to claim 1, wherein the first mask plate further comprises two end portions at two sides of the mask pattern region in the first direction, and
each of the two end portions comprises an edge flush with an outer edge of the mask frame.

14. A manufacturing method of a mask device, comprising:
fixing at least one first mask strip and at least one second mask strip on a mask frame, wherein the at least one first mask strip extends in a first direction and the at least one second mask strip extends in a second direction, the first direction is intersected with the second direction, and the at least one first mask strip and the at least one second mask strip are intersected with each other to define at least one mask opening; and
fixing a first mask plate on the mask frame, wherein the first mask plate extends in the first direction, the first mask plate comprises a mask pattern region, the mask pattern region comprises a plurality of through holes arranged in an array, the plurality of through holes comprise a first group of through holes and a second group of through holes, an orthographic projection of the at least one mask opening on the first mask plate covers the first group of through holes in the mask pattern region, and an orthographic projection of the at least one first mask strip and the at least one second mask strip on the first mask plate covers the second group of through holes in the mask pattern region.

15. The manufacturing method according to claim 14, wherein the fixing the first mask plate on the mask frame comprises: fixing the first mask plate on one side of the at least one first mask strip and the at least one second mask strip away from the mask frame.

16. An evaporation method, comprising:
   evaporating an object to be evaporated by using a mask device as a mask,
   wherein the mask device comprises:
   a mask frame;
   at least one first mask strip extending in a first direction and at least one second mask strip extending in a second direction, which are fixed on the mask frame; and
   a first mask plate extending in the first direction and fixed on the mask frame;
   wherein the first direction is intersected with the second direction, the at least one first mask strip and the at least one second mask strip are intersected with each other to define at least one mask opening,
   the first mask plate comprises a mask pattern region, the mask pattern region comprises a plurality of through holes arranged in an array, the plurality of through holes comprise a first group of through holes and a second group of through holes,
   an orthographic projection of the at least one mask opening on the first mask plate covers the first group of through holes in the mask pattern region, and an orthographic projection of the at least one first mask strip and the at least one second mask strip on the first mask plate covers the second group of through holes in the mask pattern region.

17. The evaporation method according to claim 16, wherein the object to be evaporated comprises at least one region to be evaporated,
   the at least one region to be evaporated corresponds to the at least one mask opening,
   and the at least one mask opening exposes the at least one region to be evaporated corresponding to the at least one mask opening.

18. The evaporation method according to claim 16, wherein the evaporating the object to be evaporated comprises:
   forming at least one functional layer of a light emitting element on the object to be evaporated by evaporation.

19. The evaporation method according to claim 18, wherein a pattern of the at least one functional layer is substantially the same as a pattern of each of the first group of through holes.

20. A display device, comprising a light emitting element formed by the evaporation method according to claim 16.

* * * * *